United States Patent
Doris et al.

(10) Patent No.: US 7,790,541 B2
(45) Date of Patent: Sep. 7, 2010

(54) METHOD AND STRUCTURE FOR FORMING MULTIPLE SELF-ALIGNED GATE STACKS FOR LOGIC DEVICES

(75) Inventors: Bruce B. Doris, Brewster, NY (US); Mahender Kumar, Fishkill, NY (US); Werner A. Rausch, Stormville, NY (US); Robin Van Den Nieuwenhuizen, Ridgefield, CT (US)

(73) Assignees: International Business Machines Corporation, Armonk, NY (US); Advanced Micro Devices, Inc. (AMD), Sunnyvale, CA (US)

( * ) Notice: Subject to any disclaimer, the term of this patent is extended or adjusted under 35 U.S.C. 154(b) by 408 days.

(21) Appl. No.: 11/950,095

(22) Filed: Dec. 4, 2007

(65) Prior Publication Data

US 2009/0140347 A1 Jun. 4, 2009

(51) Int. Cl.
*H01L 21/8238* (2006.01)
*H01L 21/336* (2006.01)
*H01L 21/76* (2006.01)

(52) U.S. Cl. .............. 438/199; 438/279; 438/299; 438/439; 257/E21.545; 257/E21.637

(58) Field of Classification Search .............. 438/199, 438/279, 299, 439, 444, 981; 257/E21.545; 257/E21.637
See application file for complete search history.

(56) References Cited

U.S. PATENT DOCUMENTS

| | | | |
|---|---|---|---|
| 6,180,456 B1 * | 1/2001 | Lam et al. | 438/258 |
| 6,232,164 B1 | 5/2001 | Tsai et al. | |
| 6,346,445 B1 * | 2/2002 | Hsu | 438/279 |
| 6,645,818 B1 | 11/2003 | Sing et al. | |
| 6,653,698 B2 | 11/2003 | Lee et al. | |
| 6,696,345 B2 | 2/2004 | Chau et al. | |
| 6,861,712 B2 | 3/2005 | Gao et al. | |
| 6,872,613 B1 | 3/2005 | Xiang et al. | |
| 7,005,706 B2 | 2/2006 | Hiraizumi | |
| 7,029,966 B2 | 4/2006 | Amos et al. | |
| 7,056,782 B2 | 6/2006 | Amos et al. | |
| 7,160,771 B2 * | 1/2007 | Chou et al. | 438/241 |
| 2004/0099860 A1 * | 5/2004 | Doris et al. | 257/19 |
| 2007/0048920 A1 | 3/2007 | Song et al. | |
| 2007/0111421 A1 * | 5/2007 | Cabral et al. | 438/199 |
| 2007/0152276 A1 * | 7/2007 | Arnold et al. | 257/369 |

FOREIGN PATENT DOCUMENTS

CN 1988135 A 6/2007

* cited by examiner

*Primary Examiner*—Shouxiang Hu
(74) *Attorney, Agent, or Firm*—Cantor Colburn LLP; Daniel Schnurmann

(57) ABSTRACT

A method for forming multiple self-aligned gate stacks, the method comprising, forming a first group of gate stack layers on a first portion of a substrate, forming a second group of gate stack layers on a second portion of the substrate adjacent to the first portion of the substrate, etching to form a trench disposed between the first portion and the second portion of the substrate, and filling the trench with an insulating material.

1 Claim, 14 Drawing Sheets

US 7,790,541 B2

METHOD AND STRUCTURE FOR FORMING MULTIPLE SELF-ALIGNED GATE STACKS FOR LOGIC DEVICES

BACKGROUND OF THE INVENTION

1. Field of the Invention

This invention relates generally to semiconductor gate device fabrication techniques, and particularly to a method and structure for forming multiple self-aligned gate stacks for logic devices and memory.

2. Description of Background

Structures in semiconductor devices such as logic gates may be fabricated on silicon wafers. The logic gates include stacks of materials that are aligned on the silicon wafers. The logic gates are formed, in part, using shallow trench isolation (STI). Existing methods for producing multiple logic gates do not allow a number of gates comprising different materials to be formed on the active regions of the silicon wafers or for the gate stacks to be self-aligned.

It is desirable to fabricate a self-aligned structure for semiconductor devices that may be easily etched, and that includes a number of gate stacks each comprising different types of materials.

SUMMARY OF THE INVENTION

The shortcomings of the prior art are overcome and additional advantages are achieved through a method for forming multiple self-aligned gate stacks, the method including, forming a first group of gate stack layers on a first portion of a substrate, forming a second group of gate stack layers on a second portion of the substrate adjacent to the first portion of the substrate, etching to form a trench disposed between the first portion and the second portion of the substrate, and filling the trench with an insulating material.

An exemplary embodiment of a plurality of gate stacks disposed on a substrate comprising, a first gate stack comprising a first electrode material, a second gate stack comprising a second electrode material, a third gate stack comprising a third electrode material, a first shallow trench isolation region disposed between the first gate stack and the second gate stack, and a second shallow trench isolation region disposed between the second gate stack and the third gate stack.

An exemplary embodiment of gate stacks disposed on a substrate comprising, a first gate stack comprising a first electrode material, a second gate stack comprising a second electrode material, and a shallow trench isolation region disposed between the first gate stack and the second gate stack.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The subject matter, which is regarded as the invention, is particularly pointed out and distinctly claimed in the claims at the conclusion of the specification. The foregoing and other aspects, features, and advantages of the invention are apparent from the following detailed description taken in conjunction with the accompanying drawings in which:

FIG. 1t is illustrated along a line A-A shown in FIG. 5.

The detailed description explains the preferred embodiments of the invention, together with advantages and features, by way of example with reference to the drawings.

DETAILED DESCRIPTION OF THE INVENTION

Systems and methods involving self-aligning contact structures are provided. Several exemplary embodiments are described.

Figure 4:
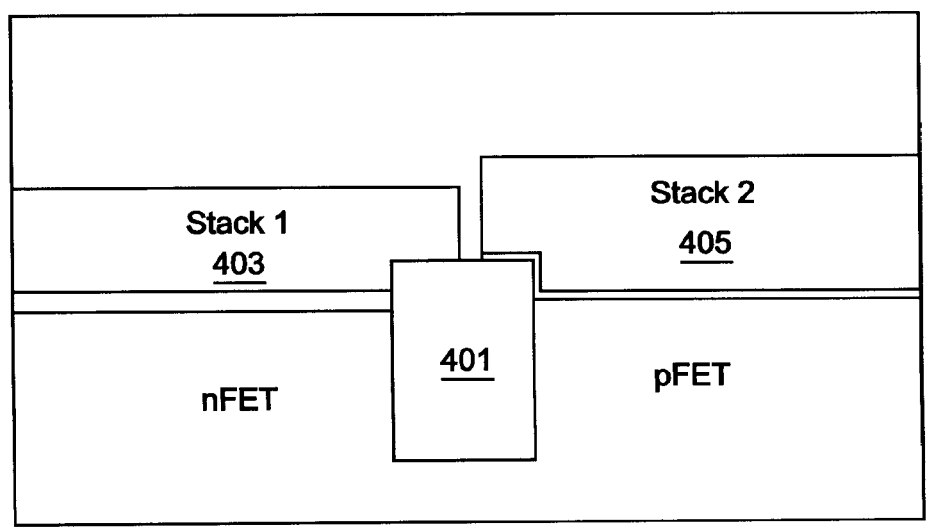
FIG. 4 illustrates a partially cut-away side view of a prior art example of overlapped gate stacks.

FIG. 4 illustrates a prior art example of a pair of gate stacks and an STI region. In this example, the trench 401 has been etched prior to the deposition of the gate stacks 403 and 405. Since the trench 401 has been etched before the gate stacks 403 and 405, the stacks are not self-aligned. As illustrated in FIG. 4, the gate stacks 403 and 405 overlap the trench 401. This may be caused by the overlay and critical dimension tolerance of the process. In some instances, the gate stack 1 and the gate attack 2 may completely overlap (not shown). The result of the overlap is an incomplete gate etch and degradation in product yield.

Another possible result of non-self aligning gate stacks is that a stack may underlap the active nFET and pFET regions. The result of underlapped stacks is that the etch may be in a source/drain region of the gate and cause a degradation in the product yield. By etching the trench after depositing the gate stacks, the stacks are self-aligned. Self-aligned stacks avoid the above described drawbacks of the prior art.

Figure 1A:
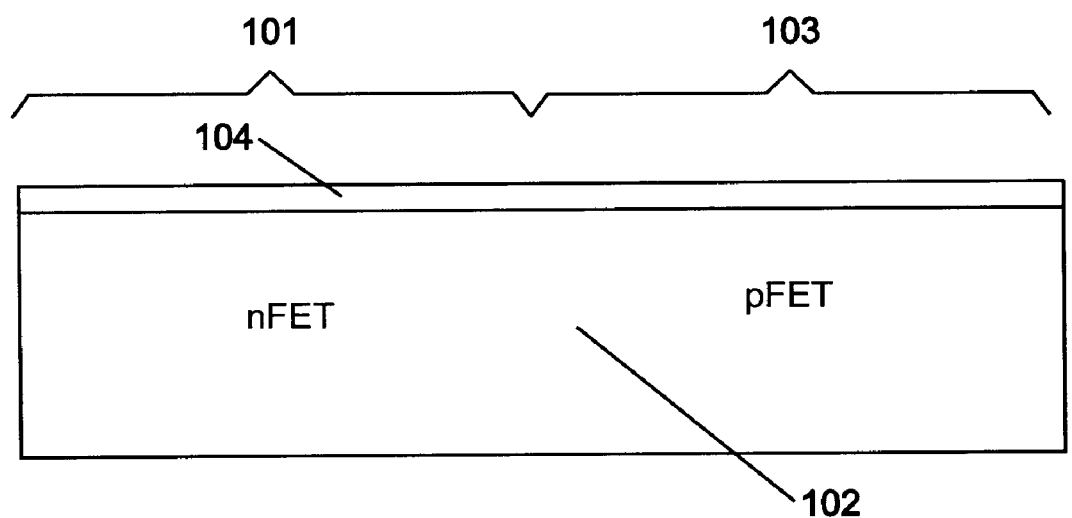
FIGS. 1a-1k, 1m-1n, and 1p-1t illustrate a partially cut-away side view of steps in an exemplary method for fabricating a self-aligned gate structure.

FIGS. 1a-1i illustrate side partially cut-away views of the steps in an exemplary method for forming a self-aligning gate stacks for a semiconductor logic device. In this regard, FIG. 1a illustrates a substrate 102. In this exemplary embodiment, the substrate is a doped bulk silicon substrate including a negative channel field effect transistor (nFET) portion 101 and a positive channel field effect transistor (pFET) portion 103. In alternate embodiments, the substrate may include a silicon-on-insulator (SOI) layer, or may not be doped. A number of layers of materials are deposited over the substrate 102 that will eventually form gate stacks (not shown in FIG. 1a). A zero level alignment mark (not shown) may be formed using lithography and etching. The zero level alignment mark may be used to align block level lithography masks for well implants and to align the gate levels for structures formed in the method. In the first step of the illustrated method, a first gate dielectric layer 104 of, for example, SiO$_2$ is deposited on the substrate 102. The first gate dielectric layer 104 in this embodiment is about 6 nm thick.

Figure 1B:
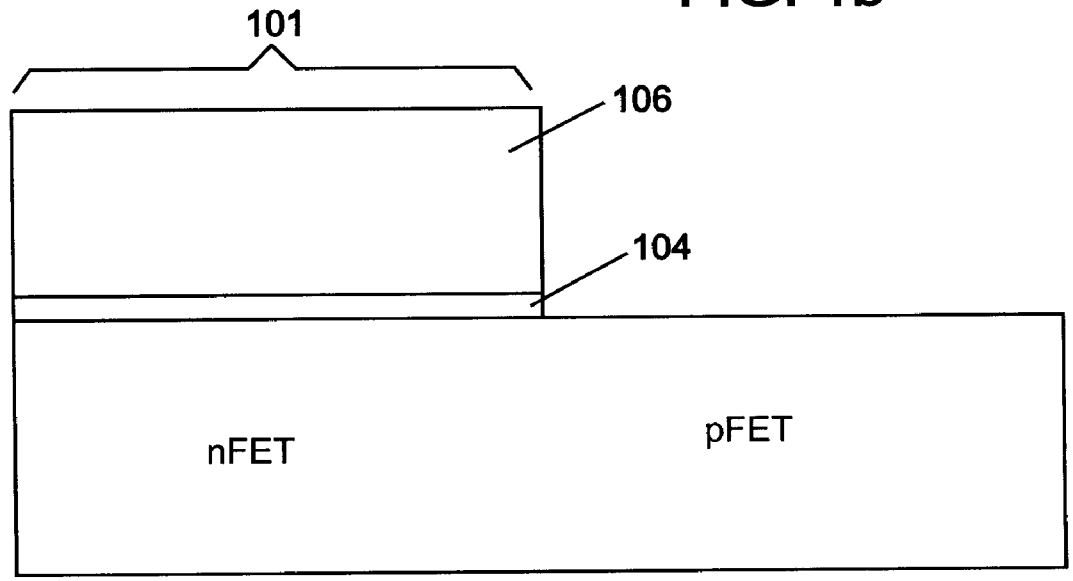
Figure 1C:
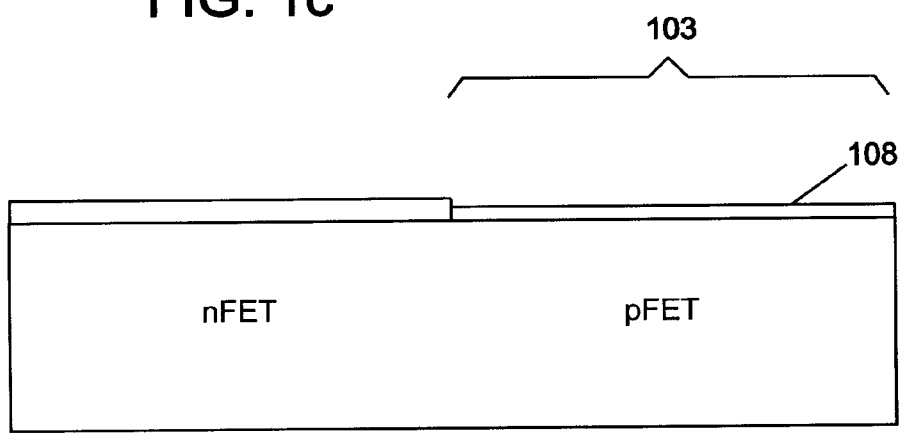

FIG. 1b illustrates a block level resist feature that is patterned using a standard photolithography process. The block level resist feature is used to block the nFET portion 101 so that the first gate dielectric layer 104 may be preserved in the nFET portion 101 while the first gate dielectric layer 104 may be removed in the exposed pFET portion 103.

Figure 1D:
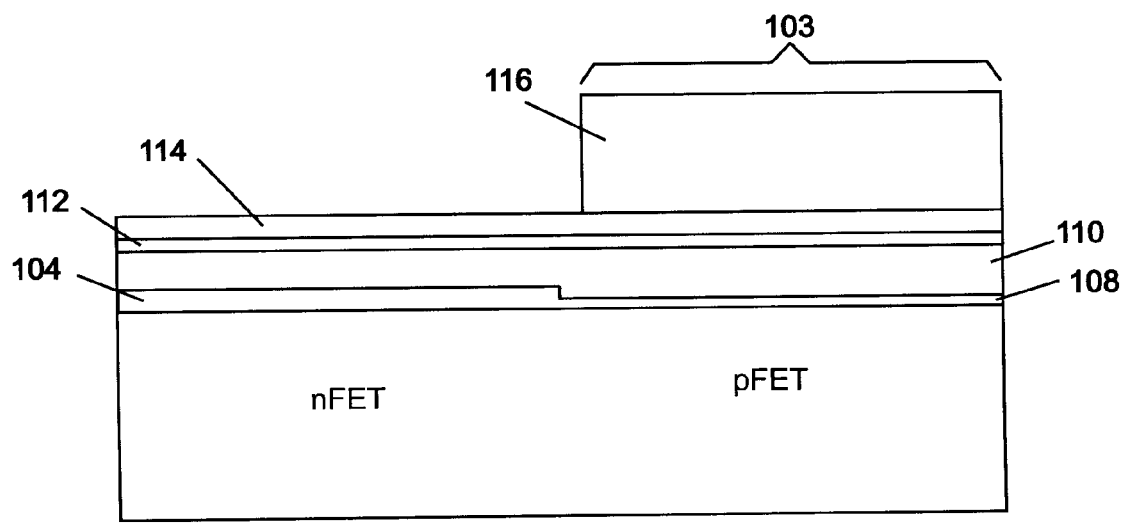

In FIG. 1d, a layer 110 of a first electrode material is deposited over the layers of SiO$_2$ 104 and 108. The layer 110 of first electrode material will form the electrode for a pFET stack. In the illustrated embodiment, the layer 110 of first electrode material comprises polysilicon. However, other suitable materials may be used including, for example, a metal such as titanium nitride, a combination of materials, or a combination of layers of materials. A third layer 112 of $SiO_2$ is deposited over the layer 110 of first electrode material, and serves as a pad oxide layer. A first hardmask layer 114 is deposited over the third layer 112 of $SiO_2$. In the illustrated embodiment, the first hardmask layer 114 comprises SiN, although other suitable materials may be used to form the first hardmask layer 114. After the first hardmask layer 114 is deposited, a second layer 116 of block-level photoresist material 116 is developed over the pFET portion 103 of the first hardmask layer 114.

Figure 1E:
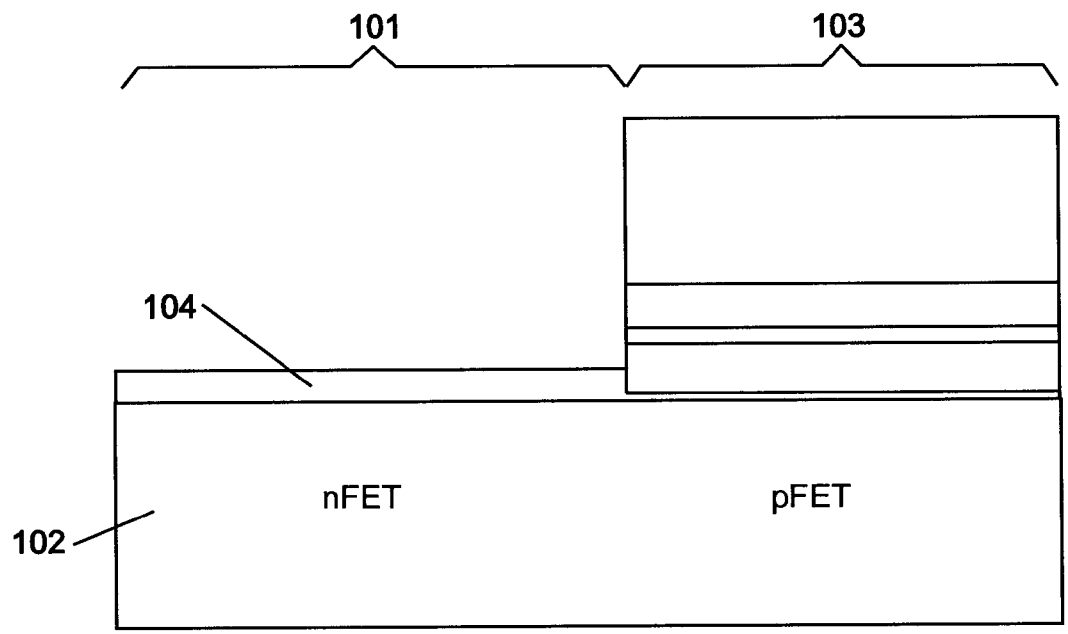
Figure 1F:
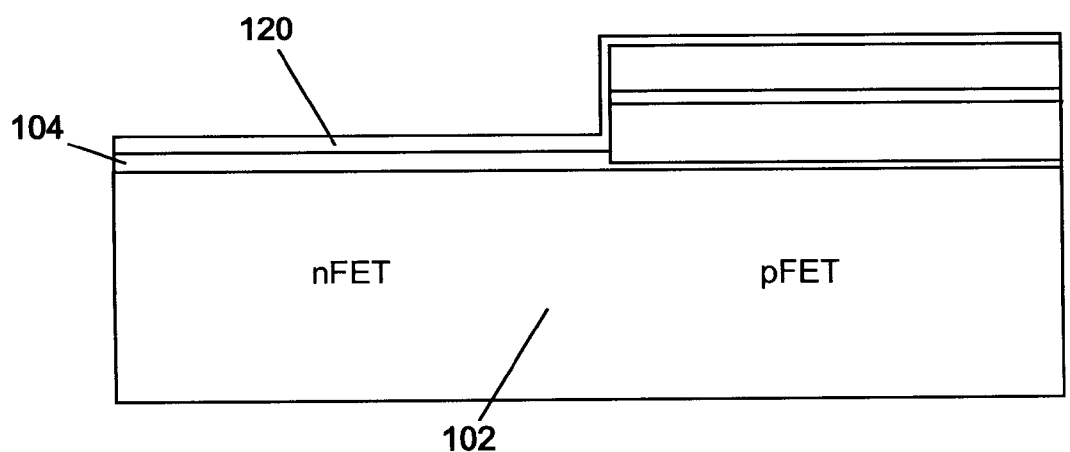

FIG. 1e illustrates the resultant structure after an etching process (for example, RIE) has removed the first nitride hardmask layer 114, the pad oxide layer 112 and the first electrode layer 110 in the nFET portion 101. The resultant structure that includes the thin layer 108 of $SiO_2$ and the layer of first electrode material 110 in the pFET portion 103 that will partially form the structure of the pFET gate stack. FIG. 1f illustrates the method for forming an nFET gate stack in the nFET portion 101 that comprises different materials than the pFET gate stack.

In this regard, referring to FIG. 1f, the second layer 116 of resist material 116 has been removed. A preclean operation is used to remove the first gate dielectric layer 104 and clean the Si surface prior to forming a interfacial oxide layer by a chemical oxidation process, and is followed by formation of a high-K layer (e.g., hafnium oxide, $HfO_2$), collectively designated as 120, is deposited over the first gate dielectric layer 104 and the layers of the pFET gate stack. The high-K layer may contain a work function shifting material such as, for example, lanthanum oxide, but may also include other suitable materials. Alternately, a work-function shifting material may be deposited on the high-K material.

Figure 1G:
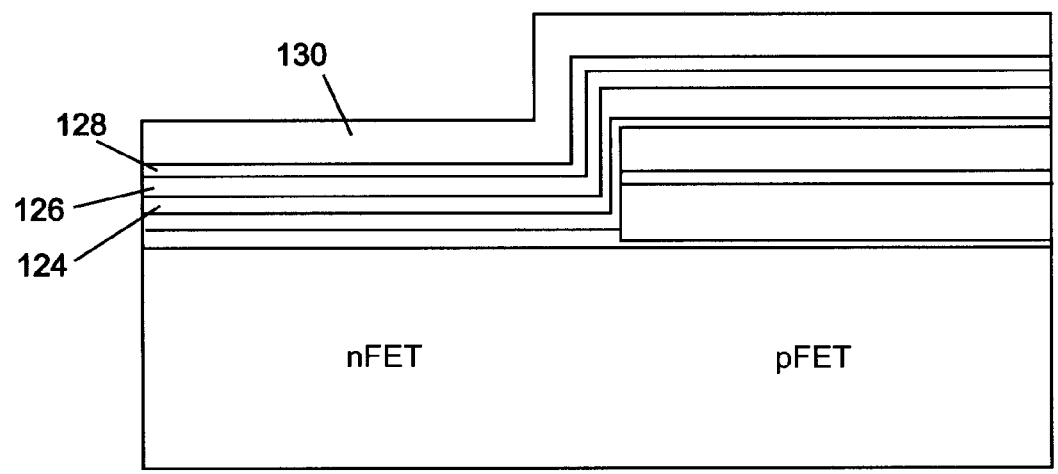

In FIG. 1g, a layer 124 of a second electrode material is deposited over the layer of the insulating material 122. In this embodiment, the second electrode material is a metal, such as titanium nitride, for example. Other alternate embodiments may include other suitable materials for the second electrode material of layer 124. An optional amorphous silicon layer 126 may then be deposited over the layer of the second electrode material 124. A fourth layer 128 of $SiO_2$ is deposited over the amorphous silicon layer 126 as a sacrificial layer, and a second hardmask layer 130 of SiN is deposited over the fourth layer 128 of $SiO_2$ 128.

Figure 1H:
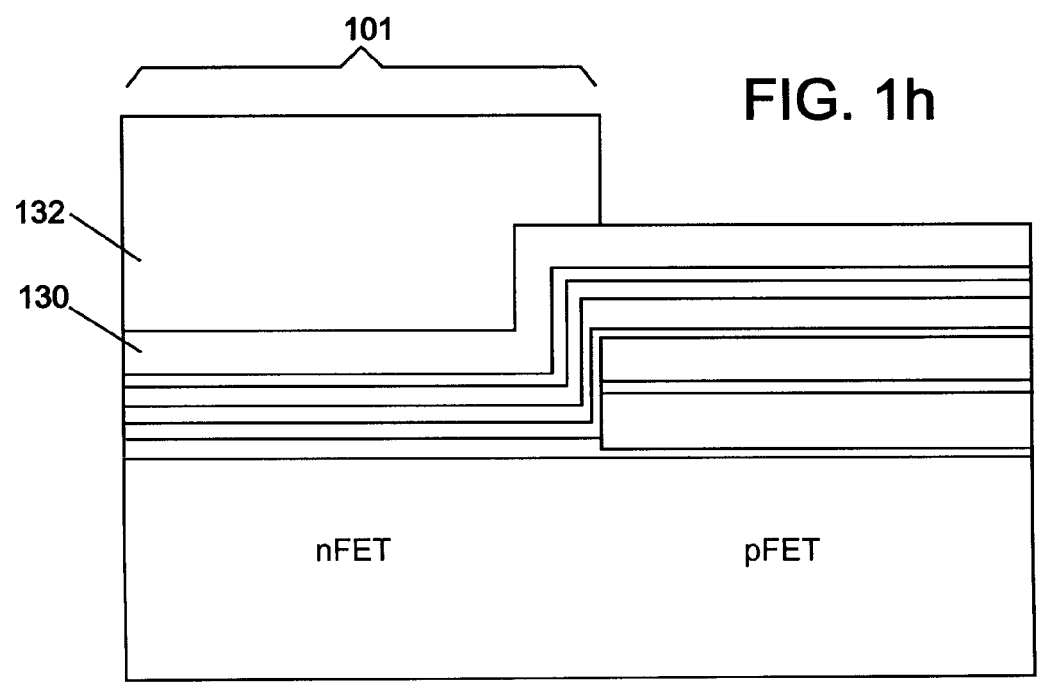
Figure 1I:
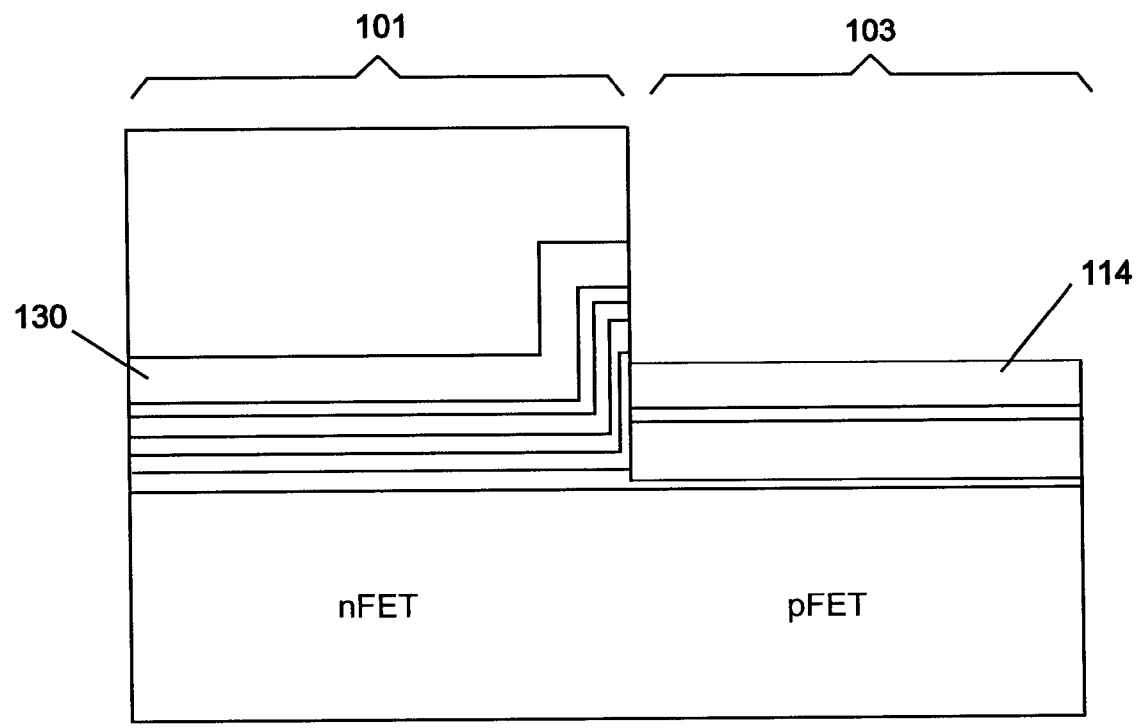

FIG. 1h illustrates a third block of photoresist material 132 developed over the nFET portion 101 of the second hardmask layer 130. FIG. 1i illustrates the resultant structure following the etching of the material in the pFET portion 103, stopping on the first hardmask layer 114.

Figure 1J:
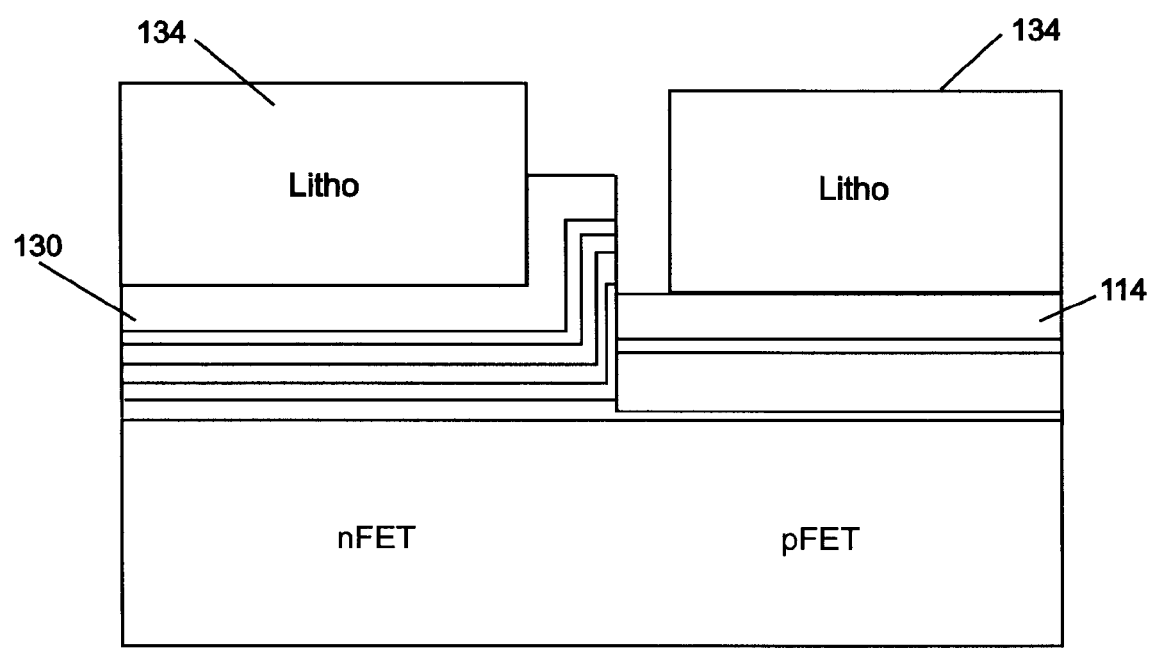
Figure 1K:
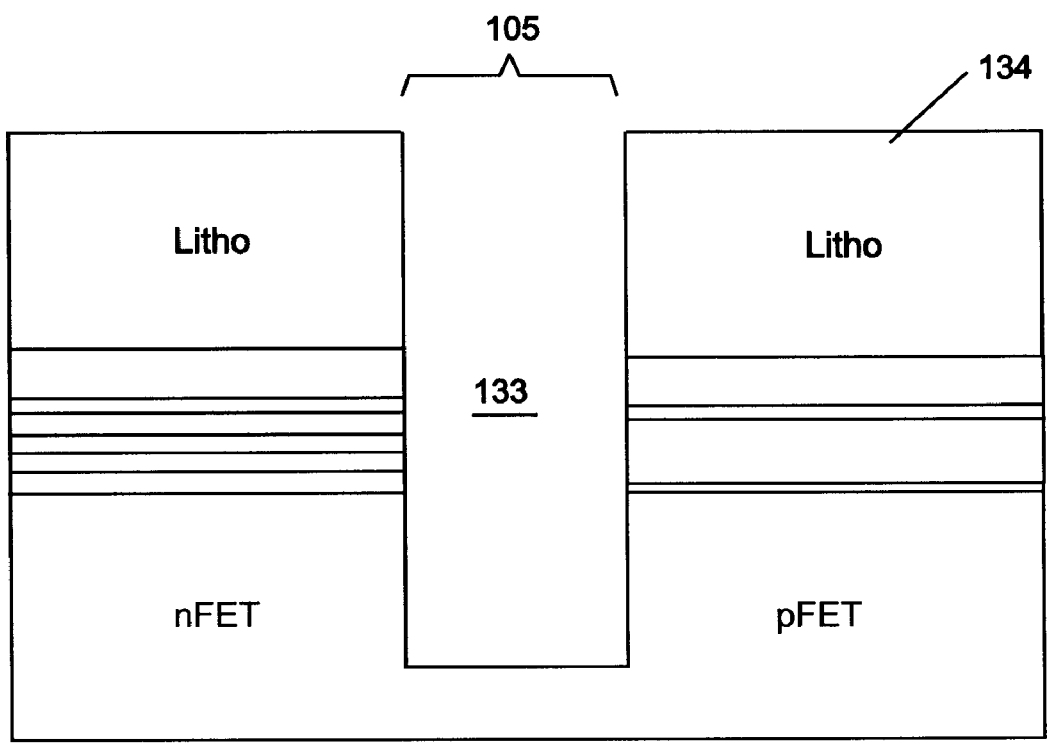
Figure 1M:
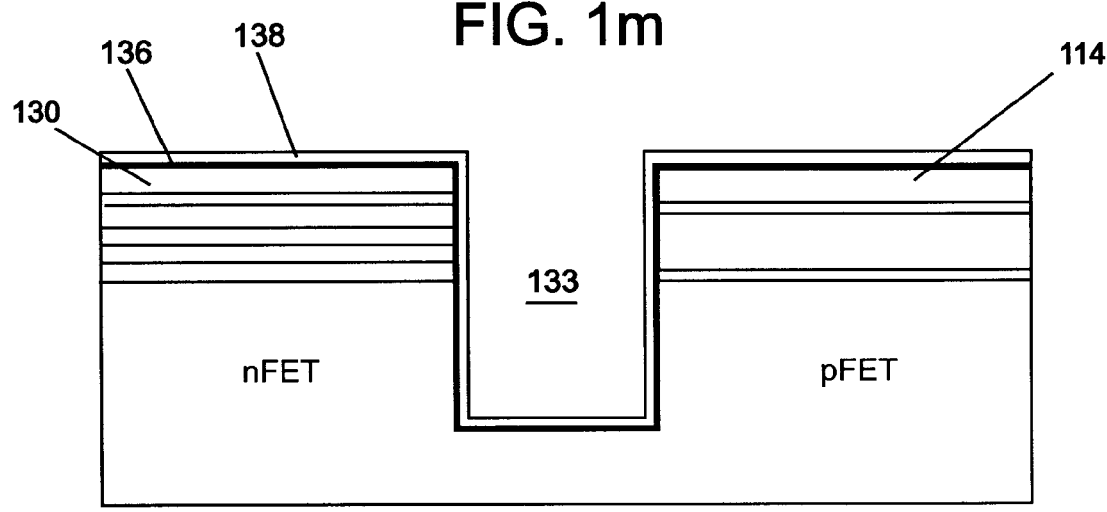

FIG. 1i thus illustrates examples of two partially formed gate stacks. A first partially formed gate stack is in the pFET portion 103 and includes the thin layer of $SiO_2$ 108 and the layer 110 of first electrode material. The third layer 112 of $SiO_2$ will subsequently act as a sacrificial layer during later processing. The first hardmask layer 114 will also be used to protect the first partially formed gate stack during later processing. A second partially formed gate stack is in the nFET portion 101. The second partially formed gate stack includes the first layer of $SiO_2$ 104, the combination high-K/amorphous oxide layer 120, the layer 124 of the second electrode material, and the amorphous silicon layer 126. The fourth layer 128 of $SiO_2$ will subsequently act as a sacrificial layer during later processing. The second hardmask layer 130 will also be used to protect the second partially formed gate stack during later processing. At this point, similar steps to those described above may be followed to form additional portions of gate structures having alternate materials in other portions of the substrate 102. Using the above-described method, virtually any number of additional structures having different materials may be formed on the substrate 102. Once the desired number of gate structures have been partially formed, STI regions may be formed on the substrate 102. FIG. 1j illustrates an example of an STI region defined by the development of a photoresist layer 134 on the both first hardmask layer 114 and the second hardmask layer 130. An opening 105 formed in resist layer 134 is used to etch a trench 133 in the substrate 102, as shown in FIG. 1k. In FIG. 1m, the resist layer 134 has been removed and a liner layer 136 comprising, for example, chemical oxide has been deposited over the first hardmask layer 114, the second hardmask layer 130, and the surfaces of the trench 133. An anti-oxidation layer 138 comprising, for example, SiN may be deposited over the liner layer 136. The liner layer 136 and the anti-oxidation layer 138 are optional and may be included based on design specifications and the properties of the materials used in the gate stacks.

Figure 1N:
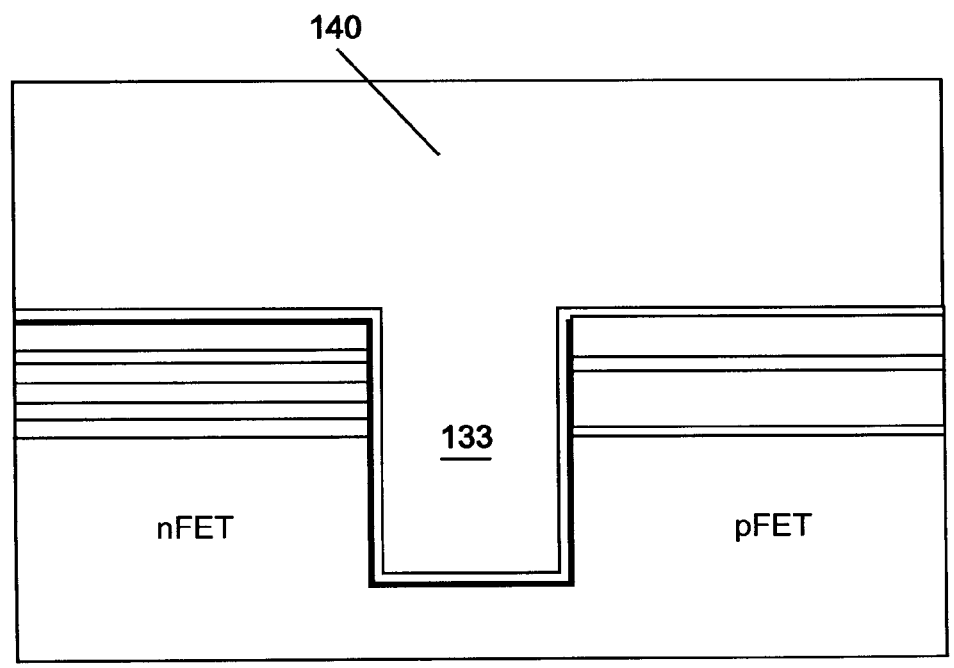
Figure 1P:
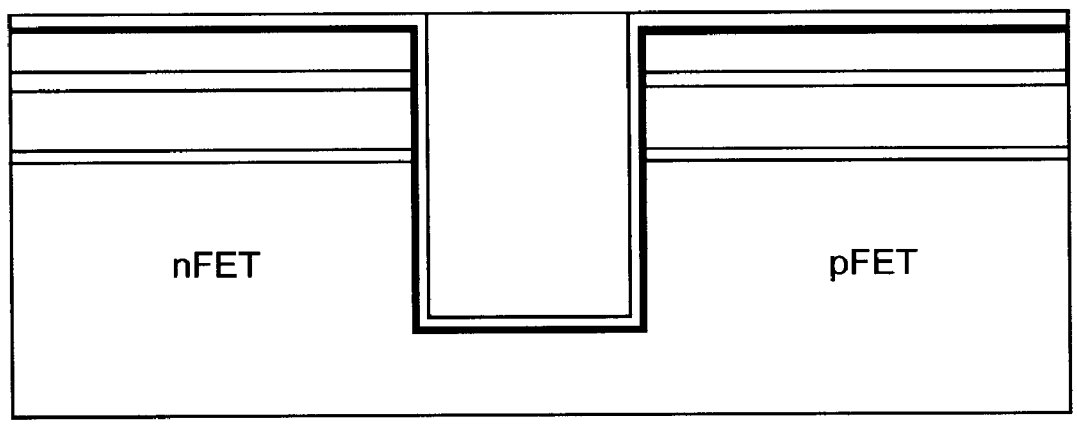
Figure 1Q:
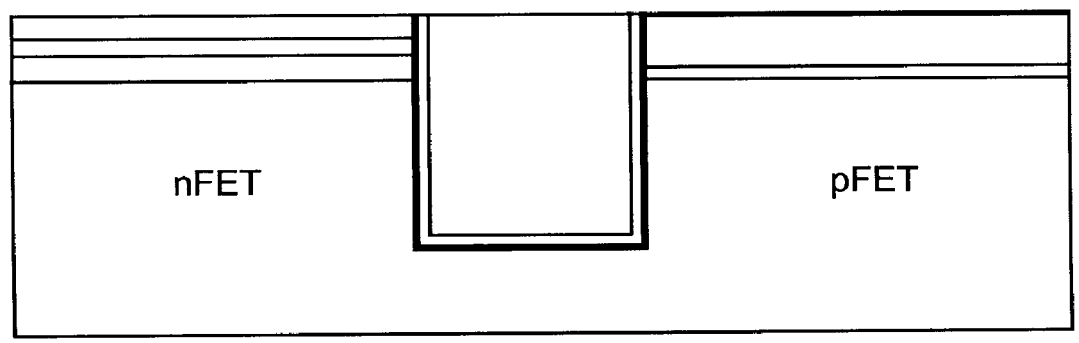

Referring to FIG. 1n, trench fill oxide 140 comprising, for example, $SiO_2$ is deposited over the anti-oxidation layer 138 and fills the trench 133. In FIG. 1p, the overburden of the trench fill oxide 140 is removed by a suitable process such as, for example, chemical mechanical polishing (CMP). In FIG. 1q, the first hardmask layer 114, the second hardmask layer 130, the third layer 112 of $SiO_2$, and the fourth layer 128 of $SiO_2$ have been removed. This process may be accomplished using any suitable techniques such as RIE and diluted HF, for example.

Figure 1R:
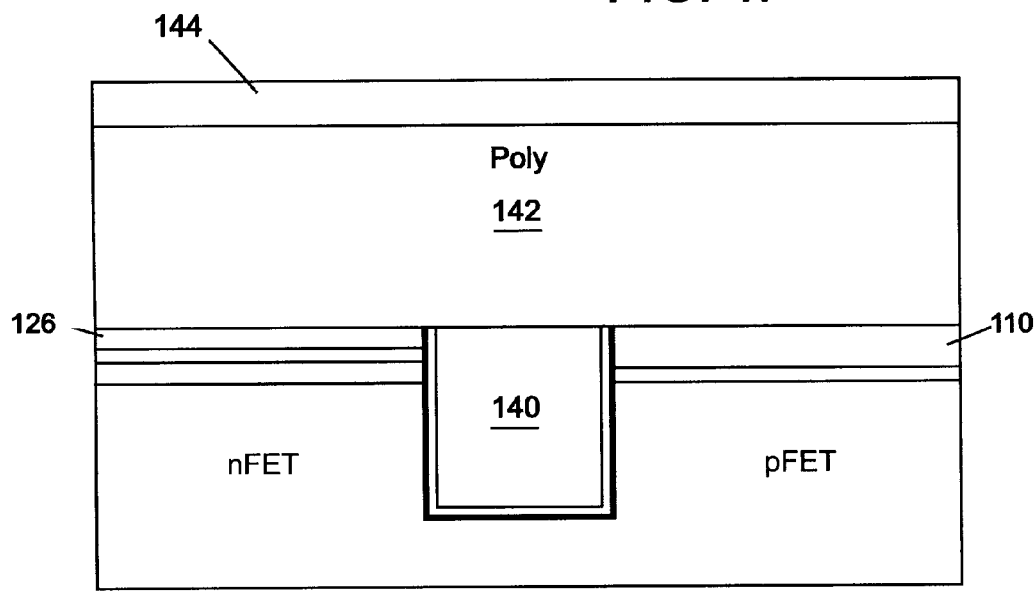

In FIG. 1r, a layer 142 of polysilicon is deposited over the first electrode material 110, the amorphous silicon layer 126, and the trench fill oxide 140. A third hardmask layer 144 is deposited over the layer 142 of polysilicon. The third hardmask layer 144 may comprise, for example, $SiO_2$.

Figure 1S:
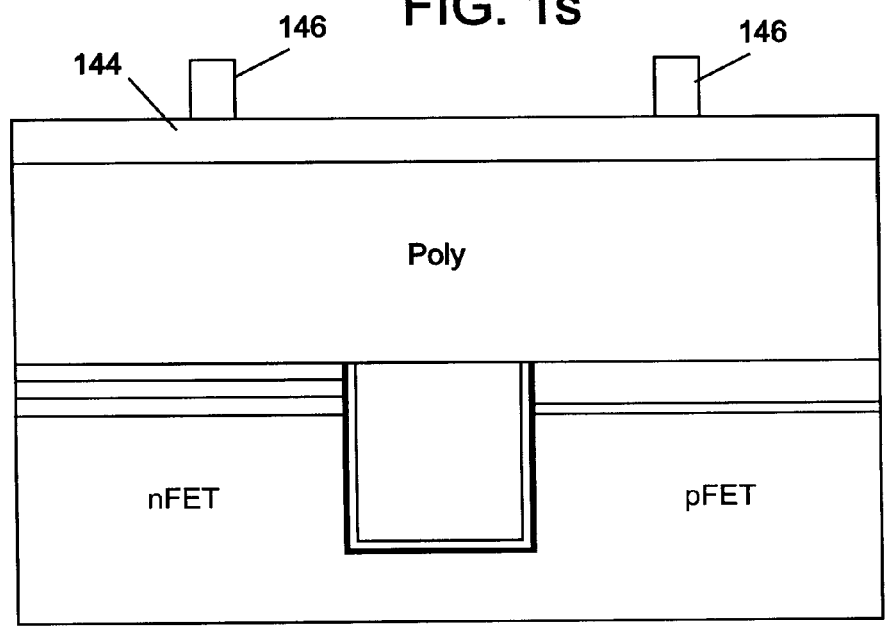
Figure 1T:
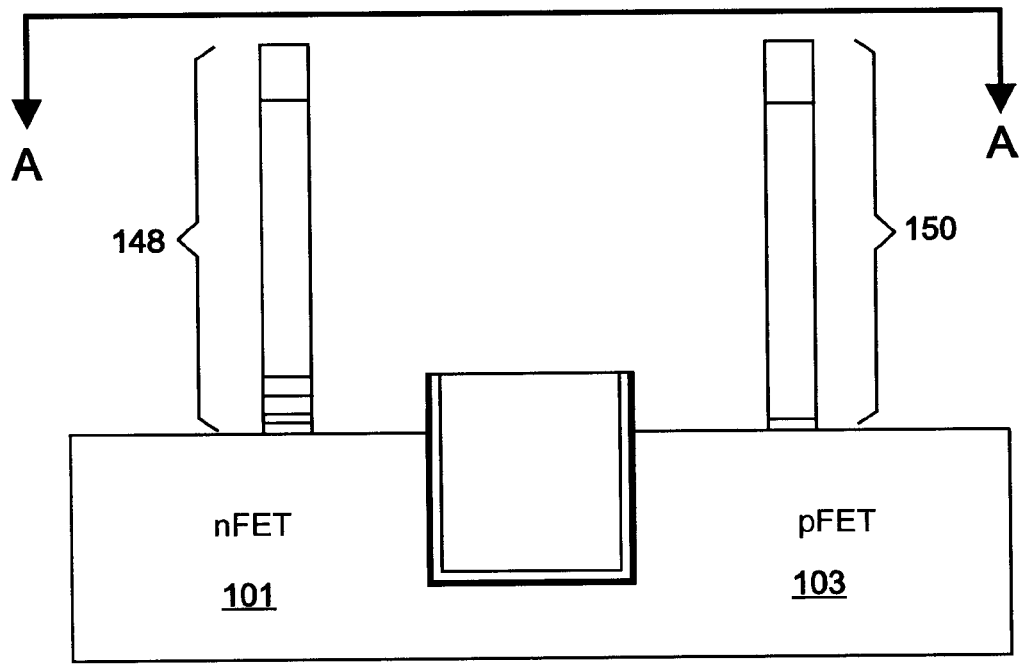
Figure 2:
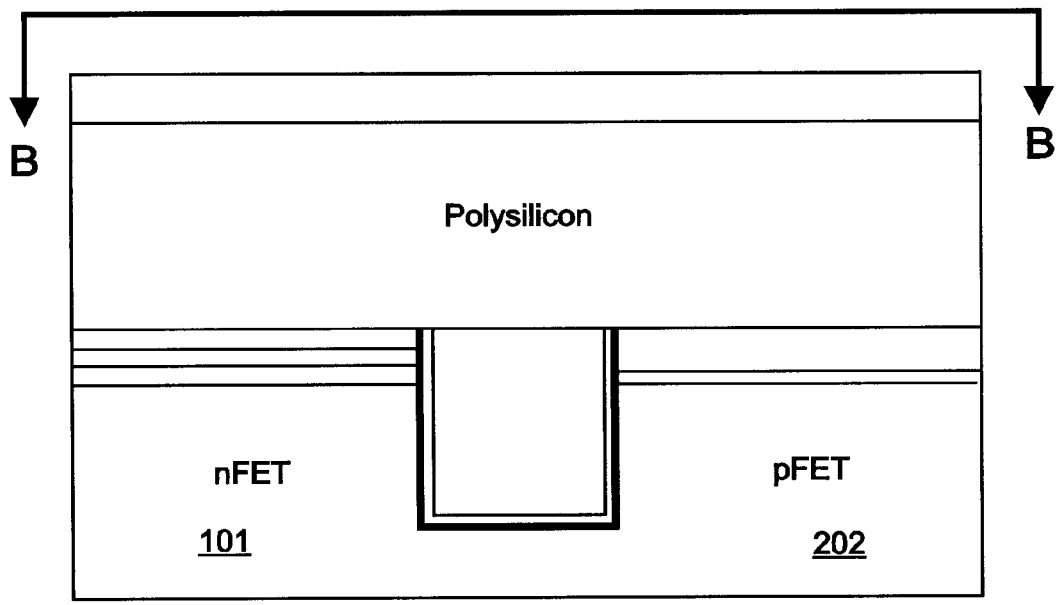
FIG. 2 illustrates a partially cut-away side view of a self-aligned gate structure shown in FIG. 5 along the line B-B.
Figure 5:
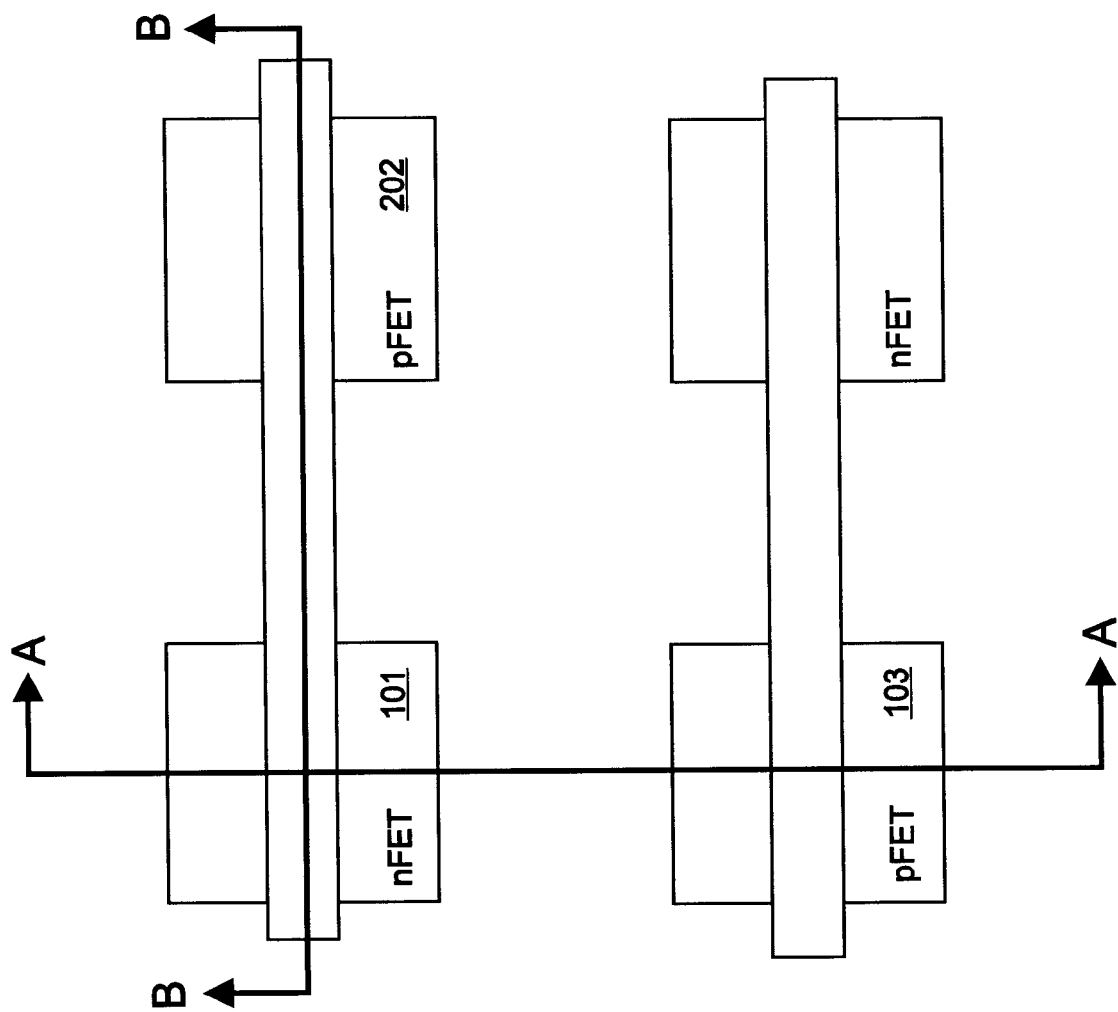
FIG. 5 illustrates a top-down view of an embodiment of a self-aligned gate structure.

FIG. 1s illustrates a photoresist 146 that is developed on the third hardmask layer 144 and defines the gate stacks. An etch is performed and the resultant structure is illustrated in FIG. 1t. In particular, FIG. 1t illustrates a partially cut-away view of an nFET gate stack 148 and a pFET gate stack 150 disposed on the nFET portion 101 and the pFET portion 103 respectfully along a line A-A. A top-down view of a pair of gate structures including the partially cut-away structures of FIG. 1t is illustrated in FIG. 5. FIG. 5 also includes the nFET portion 101 and a second pFET portion 202 in a structure divided with a line B-B. FIG. 2 illustrates a partially cut-away view of the nFET portion 101 and the second pFET portion 202 along the line B-B. The photoresist 146 may be removed in later steps, and other processes may be used to complete the formation of the gates and the other structures on the substrate 102.

Figure 3:
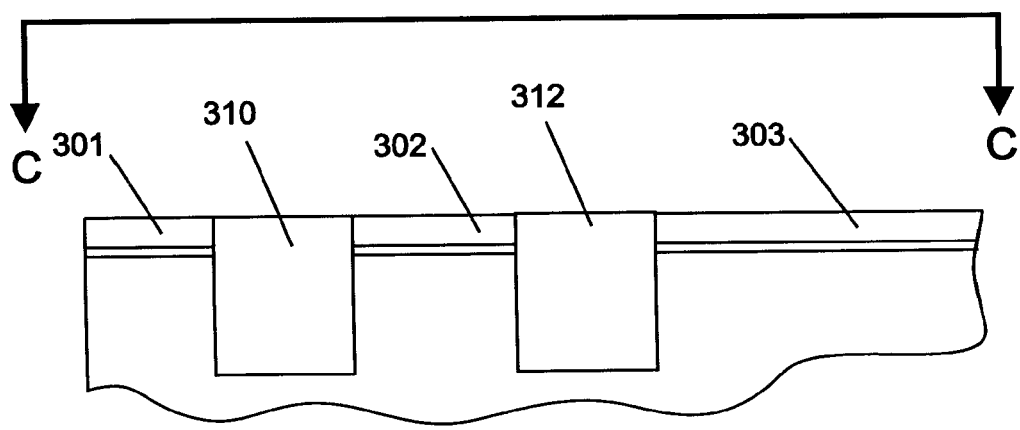
FIG. 3 illustrates a partially cut-away side view of an alternate embodiment of a self-aligned gate structure shown in FIG. 6 along the line C-C.
Figure 6:
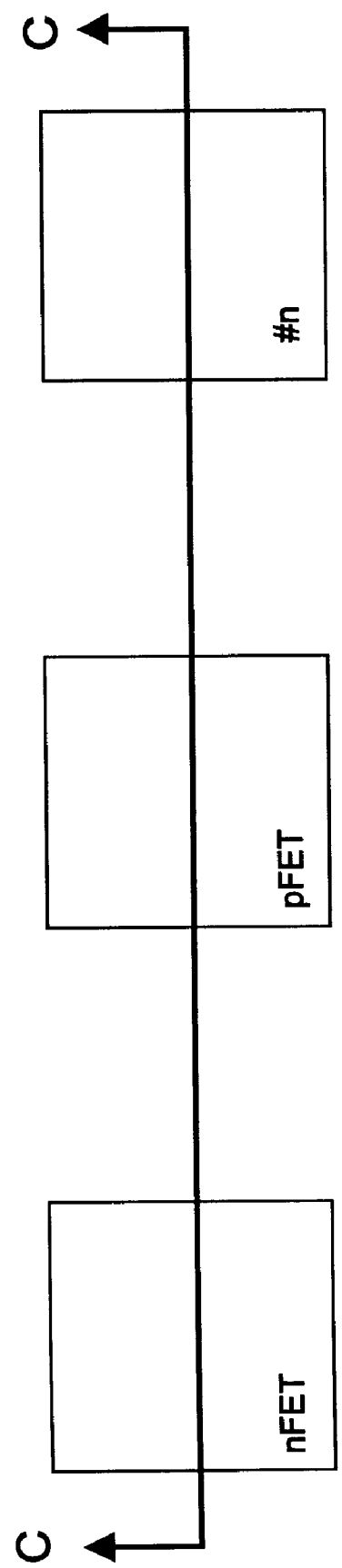
FIG. 6 illustrates a top-down view of an alternate embodiment of a self-aligned gate structure.

FIG. 6 illustrates a top-down view of an embodiment of a plurality of gate stack structures. The illustrated embodiment includes an nFET, a pFET, and a #n structure. FIG. 3 illustrates a partially cut-away view along a line C-C of FIG. 6. FIG. 3 includes a plurality of gate stacks 301, 302, and 303 that correspond to the nFET, pFET, and #n of FIG. 6, each comprising different materials. The plurality of gate stacks is self-aligned during the formation of the trenches 310 and 312. Though FIGS. 3 and 6 illustrate three gate stacks, the methods described above allow an unlimited number of structures to be formed.

One advantage of the method described above is that the etching to define the trench 133 (of FIG. 1k) is performed after the deposition of the gate electrode materials. The resultant structure is self-aligned in that the etching of the trench 133 aligns the gate electrode materials with the edges of the trench. Previous methods that form trenches prior to the deposition of the gate electrode materials often result in a structure that is not self-aligned. Additionally, the illustrated method allows a plurality of gate stacks to be formed each having different materials in a self aligned manner. The number of gate stacks in the plurality of gate stacks is effectively unlimited. Previous methods limit the number of gate stacks having different types of materials.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A method for forming multiple self-aligned gate stacks, the method comprising sequentially:
    forming a lower portion of a first group of gate stack layers on a first portion of a substrate by:
        forming a first layer of gate dielectric on a substrate;
        depositing a first electrode layer on the first layer of gate dielectric;
        depositing a first sacrificial layer of material on the first electrode layer;
        depositing a first hardmask layer on the first sacrificial layer of material;
        developing a block level lithography feature on the first hardmask layer to partially define a first gate stack area: and
        etching to removing a portion of the first hardmask layer, the first sacrificial layer, and the first electrode layer;
    forming a lower portion of a second group of gate stack layers on a second portion of the substrate adjacent to the first portion of the substrate by:
        depositing a second electrode layer on the first layer of gate dielectric and the first hardmask layer;
        depositing a second sacrificial layer on the second electrode layer;
        depositing a second hardmask layer on the second sacrificial layer;
        developing a block level lithography feature on the second hardmask layer to partially define a second gate stack area; and
        etching to removing a portion of the second hardmask layer, the second sacrificial layer, and the second electrode layer;
    etching to form a trench disposed between the first portion and the second portion of the substrate;
    filling the trench with an insulating material,
    forming a conductive layer on the first and second electrode layers and the trench; and
    patterning the conductive layer so as to form the first and second groups of gate stack layers.

* * * * *